US009281080B2

(12) United States Patent
Jones et al.

(10) Patent No.: US 9,281,080 B2
(45) Date of Patent: Mar. 8, 2016

(54) STAGED BUFFER CACHING IN A SYSTEM FOR TESTING A DEVICE UNDER TEST

(71) Applicant: Advantest Corporation, Tokyo (JP)

(72) Inventors: Michael Jones, San Carlos, CA (US); Edmundo Delapuente, Cupertino, CA (US); Alan S. Krech, Jr., Fort Collins, CO (US)

(73) Assignee: ADVANTEST CORPORATION, Tokyo (JP)

( * ) Notice: Subject to any disclaimer, the term of this patent is extended or adjusted under 35 U.S.C. 154(b) by 70 days.

(21) Appl. No.: 14/205,086

(22) Filed: Mar. 11, 2014

(65) Prior Publication Data

US 2015/0262705 A1 Sep. 17, 2015

(51) Int. Cl.
*G01R 31/28* (2006.01)
*G11C 29/10* (2006.01)
*G11C 29/56* (2006.01)
*G01R 31/3183* (2006.01)

(52) U.S. Cl.
CPC ........ *G11C 29/10* (2013.01); *G01R 31/318307* (2013.01); *G01R 31/318342* (2013.01); *G11C 29/56* (2013.01)

(58) Field of Classification Search
CPC .................................. G11C 29/08; G11C 29/10
See application file for complete search history.

(56) References Cited

U.S. PATENT DOCUMENTS

| 5,576,980 | A  | * | 11/1996 | Whetsel | 702/119 |
| 5,805,610 | A  | * | 9/1998  | Illes et al. | 714/738 |
| 5,925,145 | A  | * | 7/1999  | Illes et al. | 714/738 |
| 5,995,424 | A  | * | 11/1999 | Lawrence et al. | 365/201 |
| 6,173,425 | B1 | * | 1/2001  | Knaack et al. | 714/718 |
| 6,202,182 | B1 | * | 3/2001  | Abramovici et al. | 714/725 |
| 6,320,812 | B1 | * | 11/2001 | Cook et al. | 365/230.03 |
| 6,687,861 | B1 | * | 2/2004  | Jordan et al. | 714/718 |
| 6,769,083 | B1 | * | 7/2004  | Tsuto et al. | 714/738 |
| 7,375,551 | B1 | * | 5/2008  | White et al. | 326/40 |
| 7,401,272 | B1 | * | 7/2008  | Birk et al. | 714/724 |

* cited by examiner

*Primary Examiner* — Esaw Abraham

(57) ABSTRACT

A system for testing a device under test (DUT) includes a test controller unit that includes a first memory operable to store a data pattern; a bridge circuit that includes a second memory that is smaller than the first memory, and a functional unit that includes a third memory that is smaller than the second memory. Portions of the data pattern are selectively transferred from the first memory to the second memory during and for DUT testing operations. The functional circuit interfaces with the DUT for testing. Portions of the data pattern are selectively transferred from the second memory to the third memory for application to the DUT.

20 Claims, 3 Drawing Sheets

STAGED BUFFER CACHING IN A SYSTEM FOR TESTING A DEVICE UNDER TEST

BACKGROUND

In addition to testing normal read/write storage array structures, memory test systems are used to test read-only memories (ROMs), fuse mappings, non-volatile test result structures, and other components and devices not well suited for algorithmic tests (e.g., tests not well suited for data generated using an algorithm pattern generator). Conventional automated test equipment (ATE) systems typically employ large, interleaved dynamic random access memories (DRAMs) to provide high-speed read or write data for these non-algorithmic components and devices. However, interleaved DRAM test solutions are expensive in terms of cost and complexity.

SUMMARY

Embodiments according to the present invention pertain to a system and method for testing a device under test (DUT) using staged buffer caching. A test controller contains a buffer memory of random test data useful for testing non-volatile circuitry of the DUT using non-algorithmic testing operations. The test controller also includes a processor. The buffer memory may be non-interleaved DRAM. Portions of the buffer memory are selected and transferred to a first cache of a bridge circuit, and selective portions of the random data are transferred from the first cache to a second cache of a functional unit that applies the random data to test the DUT. As the functional unit needs the data, it is supplied via this transfer mechanism. Data can be supplied to the bridge and to the functional unit simultaneously. Interrupt signals may control data transference. The data within the test controller and the bridge may be compressed. The system advantageously eliminates the need for a large and expensive interleaved DRAM unit on the functional unit.

Embodiments according to the invention pertain to system for testing a device under test (DUT), where the system includes: a test controller unit that includes a first memory is operable to store a data pattern; a bridge circuit that includes a second memory that is smaller than the first memory, and a functional unit that includes a third memory that is smaller than the second memory. Portions of the data pattern are selectively transferred from the first memory to the second memory during and for DUT testing operations. The functional circuit can interface with the DUT for testing. Portions of the data pattern are selectively transferred from the second memory to the third memory for application to the DUT.

In one or more such embodiments, the data pattern is a random data pattern, the first memory of the test controller unit is a non-interleaved DRAM, the bridge circuit is a field programmable gate array (FPGA) circuit, and the functional unit is an application specific integrated circuit (ASIC).

Embodiments according to the invention also pertain to a method of testing a DUT. The method includes: storing a data pattern for testing the DUT in a buffer memory; selectively transferring portions of the data pattern from the buffer memory to a first cache memory resident within a bridge circuit, where the first cache memory is smaller than the buffer memory; selectively transferring portions of the data pattern from the first cache memory to a second cache memory resident within a functional unit that is operable to interface with and perform testing operations on the DUT, where the second cache memory is smaller than the first cache memory and where the selectively transferring operations occur simultaneously; and applying data pattern portions of the second cache memory to the DUT.

Embodiments according to the present invention reduce system cost and complexity, without negatively affecting performance (e.g., test time throughput).

These and other objects and advantages of the various embodiments of the present invention will be recognized by those of ordinary skill in the art after reading the following detailed description of the embodiments that are illustrated in the various drawing figures.

BRIEF DESCRIPTION OF THE DRAWINGS

The present invention is illustrated by way of example, and not by way of limitation, in the figures of the accompanying drawings and in which like reference numerals refer to similar elements.

DETAILED DESCRIPTION

Figure 1:
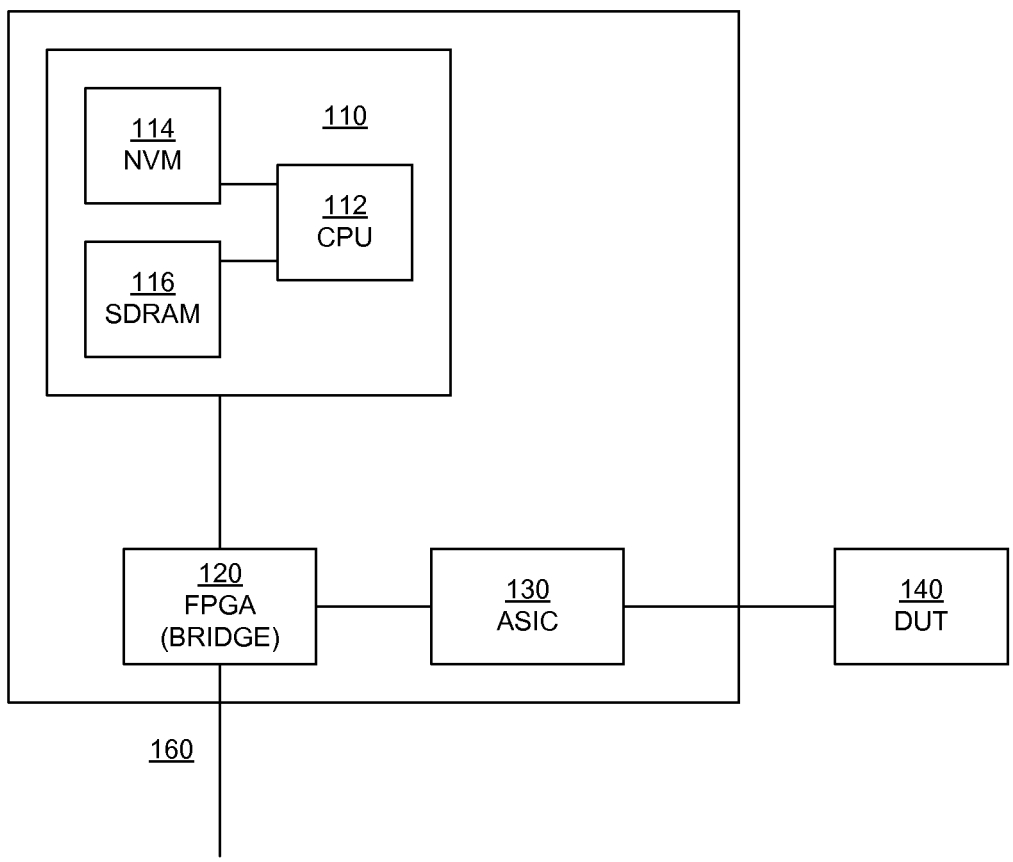
FIG. 1 is a block diagram illustrating an example of a system for implementing embodiments according to the present invention.

Reference will now be made in detail to embodiments of the present invention, examples of which are illustrated in the accompanying drawings. While the present invention will be discussed in conjunction with the following embodiments, it will be understood that they are not intended to limit the present invention to these embodiments alone. On the contrary, the present invention is intended to cover alternatives, modifications, and equivalents which may be included within the spirit and scope of the present invention as defined by the appended claims. Furthermore, in the following detailed description of the embodiments of the present invention, numerous specific details are set forth in order to provide a thorough understanding of the present invention. However, embodiments of the present invention may be practiced without these specific details. In other instances, well-known methods, procedures, components, and circuits have not been described in detail so as not to unnecessarily obscure aspects of the present invention.

Some portions of the detailed descriptions that follow are presented in terms of procedures, logic blocks, processing, and other symbolic representations of operations on data bits within a computer memory. These descriptions and representations are the means used by those skilled in the data processing arts to most effectively convey the substance of their work to others skilled in the art. In the present application, a procedure, logic block, process, or the like, is conceived to be a self-consistent sequence of steps or instructions leading to a desired result. The steps are those utilizing physical manipulations of physical quantities. Usually, although not necessarily, these quantities take the form of electrical or magnetic signals capable of being stored, transferred, combined, compared, and otherwise manipulated in a computer system. It has proven convenient at times, principally for reasons of common usage, to refer to these signals as transactions, bits, values, elements, symbols, characters, samples, pixels, or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present disclosure, discussions utilizing terms such as "receiving," "storing," "interfacing," "supplying," "applying," "transferring," or the like, refer to actions and processes of a computer system or similar electronic computing device or processor. The computer system or similar electronic computing device manipulates and transforms data represented as physical (electronic) quantities within the computer system memories, registers or other such information storage, transmission or display devices.

Embodiments described herein may be discussed in the general context of computer-executable instructions residing on some form of computer-readable storage medium, such as program modules, executed by one or more computers or other devices. By way of example, and not limitation, computer-readable storage media may comprise non-transitory computer-readable storage media and communication media; non-transitory computer-readable media include all computer-readable media except for a transitory, propagating signal. Generally, program modules include routines, programs, objects, components, data structures, etc., that perform particular tasks or implement particular abstract data types. The functionality of the program modules may be combined or distributed as desired in various embodiments.

Computer storage media includes volatile and nonvolatile, removable and non-removable media implemented in any method or technology for storage of information such as computer-readable instructions, data structures, program modules or other data. Computer storage media includes, but is not limited to, random access memory (RAM), read only memory (ROM), electrically erasable programmable ROM (EEPROM), flash memory or other memory technology, compact disk ROM (CD-ROM), digital versatile disks (DVDs) or other optical storage, magnetic cassettes, magnetic tape, magnetic disk storage or other magnetic storage devices, or any other medium that can be used to store the desired information and that can accessed to retrieve that information.

Communication media can embody computer-executable instructions, data structures, and program modules, and includes any information delivery media. By way of example, and not limitation, communication media includes wired media such as a wired network or direct-wired connection, and wireless media such as acoustic, radio frequency (RF), infrared, and other wireless media. Combinations of any of the above can also be included within the scope of computer-readable media.

FIG. 1 is a block diagram illustrating an example of a system 100 for implementing embodiments according to the present invention. In the example of FIG. 1, the system 100 includes a controller unit (controller 110) that may also be known as a test site controller. The controller 110 includes a central processing unit (CPU) 112, non-volatile memory (NVM) 114, and non-interleaved synchronous dynamic random access memory (SDRAM) 116. The SDRAM 116 may be referred to herein as a first memory.

The controller 110 is connected to a programmable logic device (PLD) 120, such as a field-programmable gate array (FPGA) that may also be known as a bridge FPGA. The PLD 120 is connected to an application specific integrated circuit (ASIC) 130, which in turn is connected to a device under test (DUT) 140. The DUT 140 may be, for example, a read-only memory (ROM), fuse map, non-volatile test result structure, or some other type of component and device not well suited for algorithmic tests (e.g., for tests not well suited for data generated using an algorithm pattern generator).

The system 100 may be known as a test site, and may be coupled in parallel to a similar test site and/or to another DUT via a link 160 from the PLD 120 to a corresponding PLD in another test site.

The system 100 may include components in addition to those just described.

Figure 2:
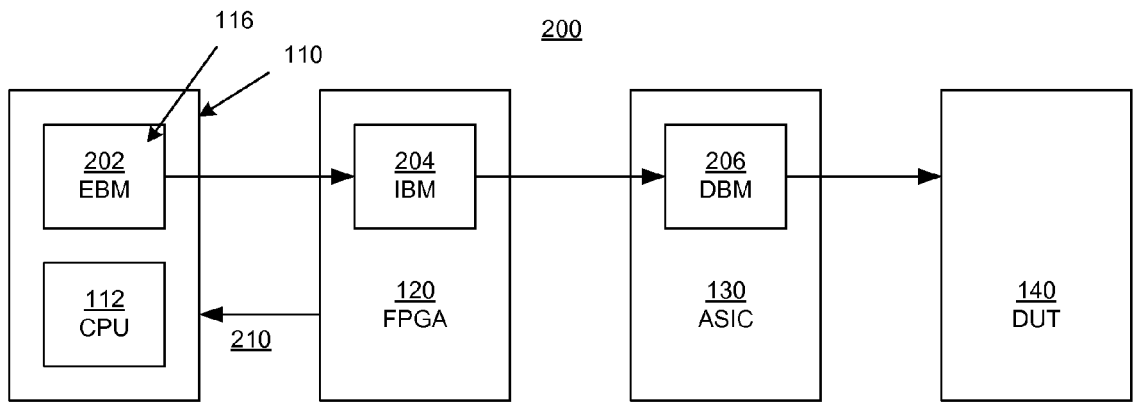
FIG. 2 is a block diagram illustrating an example of a buffer memory system for implementing embodiments according to the present invention.

FIG. 2 is a block diagram illustrating an example of a buffer memory system 200 for implementing embodiments according to the present invention.

The buffer memory system 200 provides data (arbitrary, random data) for non-algorithmic test structures such as, but not limited to, ROMs and fuse maps. The buffer memory system 200 includes a memory space referred to herein as external buffer memory (EBM) 202, an intermediate cache referred to herein as internal buffer memory (IBM) 204, and final stage referred to herein as data buffer memory (DBM) 206.

In one embodiment, the EBM 202 is implemented using non-interleaved DRAM, specifically the SDRAM 116. The EBM 202 stores the full set of test data (a random, arbitrary, non-algorithmic test pattern) for testing the DUT 140. The data stored in the EBM 202 may be compressed to improve the storage density. For example, the uncompressed data may include zero-values that pad the data for transferring data on buses wider than the data; the compressed data does not include those zero-values. The EBM 202 may be referred to herein as the first buffer memory.

The EBM 202 provides an amount of data (which may be referred to herein as a chunk, portion, or page of data) to the IBM 204. In one embodiment, the IBM 204 is implemented using SRAM embedded inside the FPGA 120. The IBM 204 may be referred to herein as the second memory, the second buffer memory, or the first cache memory.

When a test is set up, one or more portions of data can be preloaded into the IBM 204 from the EBM 202. The IBM 204 can also be loaded and/or reloaded as the test progresses. The IBM 204 can support data compression and decompression. In one embodiment, the IBM 204 is at least twice the size of the DBM 206. That is, the IBM 204 is large enough to store an amount of data equivalent to two or more buffers of information used for testing the DUT 140. However, the IBM 204 is not large enough to store all data for the test; the IBM 204 is smaller than the EBM 202.

The DBM 206 stores uncompressed data required for writing to or performing read-compares with the DUT 140. The DBM 206 can transfer data at full speed, that is, at the data rate required or specified for the DUT 140. The size of the DBM 206 is limited to one or more buffers of information used for testing the DUT 140 but is smaller than the IBM 204. The DBM 206 may be referred to herein as the third memory, the third buffer memory, or the second cache memory.

The buffer memory system 200 thus implements a staged caching system that provides data at high speed with reduced system cost and system complexity. A test program, running on the controller 110 and in communication with the ASIC 130, can specify an amount of data for application to the DUT 140. That data is supplied from the EBM 202 to the IBM 204, and from the IBM to the DBM 206. The EBM 202 allows the data to be concisely stored and quickly retrieved. The IBM 204 and DBM 206 provide predictable high-speed access for full-speed DUT testing.

In order to reduce test time overhead, it is desirable to transfer data into the DBM 206 at a point in time when the DBM is not required for the particular test step at that point in time. This transfer time is under control of the test program. There are convenient times during the test flow that data can be transferred to the DBM 206. For flash memory devices, for example, the transfer can occur during $t_R$ (read times).

The transfer of data out of the EBM 202 is hidden from the test flow. Because the IBM 204 can store at least twice the amount of data (two buffers of data) needed for the DBM 206, there should always be one buffer of data available for the DBM and hence for the DUT 140.

To prevent the IBM 204 from running out of data for the DBM 206, the FPGA 120 can send an interrupt 210 to the controller 110 (FIG. 1) to initiate a transfer of data from the EBM 202 to the IBM. The interrupt 210 can be generated when the amount of data in the IBM 204 is reduced to some threshold level. The threshold level is programmable.

Decompression of the compressed data in the EBM 202 can occur either as part of the transfer of the data from the EBM to the IBM 204 or as part of the transfer of the data from the IBM and to the DBM 206. Thus, the IBM 204 can store compressed and/or decompressed data depending on the location of the decompression. The decompression step helps to close the gap between the slower EBM access and the faster IBM-to-DBM transfer requirement.

The controller 100 can control the test flow without constantly monitoring the data needs of the IBM 204. This autonomy is facilitated by the interrupt requests 210 from the IBM logic (FPGA 120) to the controller 110, which is followed by low-overhead, direct memory access (DMA) transfer of data from the EBM 202 to the IBM 204. Relatively little processor time is expended to maintain the flow of data from the EBM 202 to the IBM 204. Transfer of data from the IBM 204 to the DBM 206 is independent of the controller 110; it does not rely on the resources of the controller.

The benefits of the buffer memory system 200 include reduced system cost and complexity. The use of non-interleaved SDRAM 116 (EBM 202) is superior in this regard. Because of the overhead that already exists in the test flow, the performance (e.g., test time throughput) will not be negatively affected. Furthermore, associated software can be simplified: software between the IBM 204 and DBM 206 is not needed; and the interrupt service with DMA is relatively simple. These features can significantly reduce the test time of data flow control and the complexity of software development.

Figure 3:
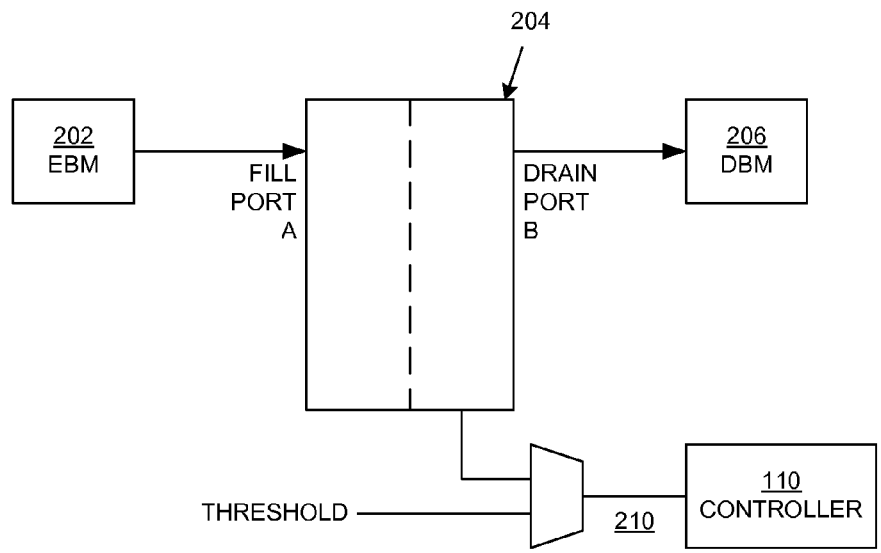
FIG. 3 is a block diagram illustrating an example of a buffer memory for implementing embodiments according to the present invention.

FIG. 3 is a block diagram illustrating an embodiment of the IBM 204. As described above, the IBM 204 is implemented within the FPGA 120 and can cache an amount of data (a page or more) that is larger than the amount of data that can be stored by the DBM 206. Data can be transferred from the IBM 204 to the DBM 206 quickly, but not necessarily in real time. The FPGA 120 can generate an interrupt 210 to the controller 110 if the amount of data in the IBM 204 is less than a threshold amount.

In the FIG. 3 embodiment, the IBM 204 has two ports: a fill port A and a drain port B. Data from the EBM 202 is received by the IBM 204 via the fill port A, and is sent to the DBM 206 via the drain port B. The ports A and B can operate concurrently. In one embodiment, the FPGA 120 unpacks the compressed data received from the EBM 202, and packs (formats) the data (e.g., pads the data) for the DBM 206 and the DUT 140. The unpacking/packing operations can occur upstream or downstream of the IBM 204.

Figure 4:
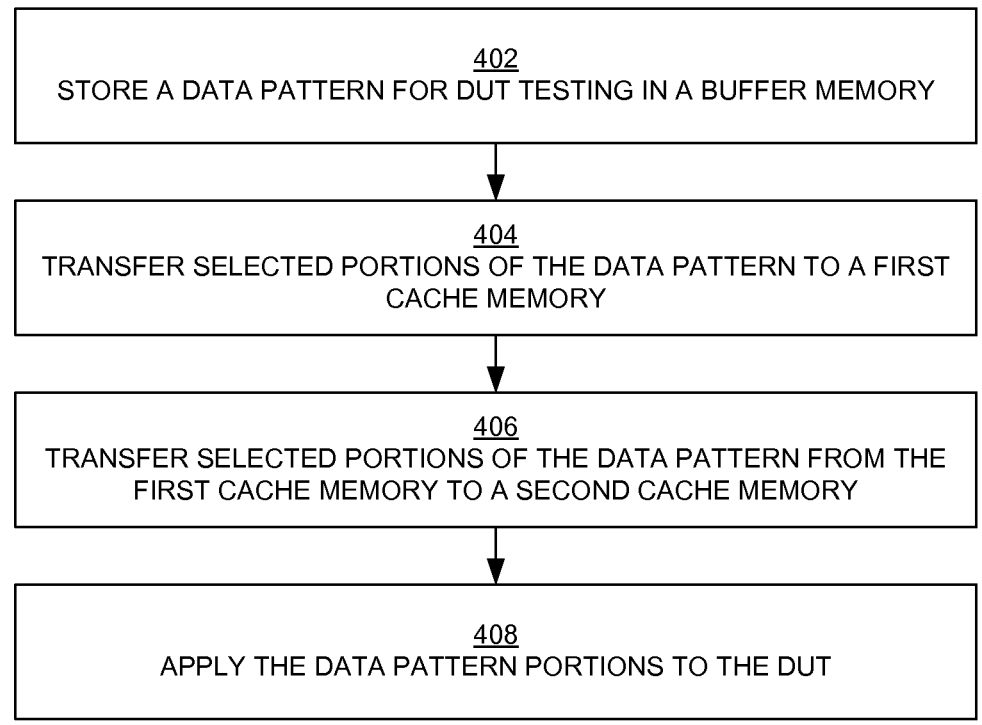
FIG. 4 is an example of a method for testing a device under test in embodiments according to the present invention.

FIG. 4 is a flowchart 400 of an example of a method for testing a DUT in embodiments according to the present invention. Although specific steps are disclosed in the flowchart 400, such steps are exemplary. That is, embodiments according to the present invention are well suited to performing various other steps or variations of the steps recited in the flowchart 400. The flowchart 400 can be implemented using the system 100 of FIG. 1, including the buffer memory system 200 of FIG. 2.

In block 402 of FIG. 4, a data pattern for testing a DUT is stored in a buffer memory (e.g., EBM 202 of FIG. 2, in SDRAM 116 of FIG. 1).

In block 404 of FIG. 4, with reference also to FIGS. 1 and 2, portions of the data pattern are selectively transferred from the buffer memory to a first cache memory (e.g., IBM 204) resident within a bridge circuit (e.g., the FPGA 120 of FIG. 1). The first cache memory is smaller than the buffer memory.

In block 406 of FIG. 4, with reference also to FIGS. 1 and 2, portions of the data pattern are selectively transferred from the first cache memory to a second cache memory (e.g., DBM 206) resident within a functional unit (e.g., the ASIC 130) that is operable to interface with and perform testing operations on the DUT. The second cache memory is smaller than the first cache memory. The operations of block 404 and 406 can occur simultaneously.

In block 408 of FIG. 4, the data pattern portions are applied to the DUT.

In summary, embodiments according to the present invention reduce system cost and complexity, without negatively affecting performance (e.g., test time throughput). The need for a large and expensive interleaved DRAM unit on the functional unit can be eliminated.

In the foregoing specification, embodiments of the invention have been described with reference to numerous specific details that may vary from implementation to implementation. Thus, the sole and exclusive indicator of what is, and is intended by the applicant to be, the invention is the set of claims that issues from this application, in the specific form in which such claims issue, including any subsequent correction. Hence, no limitation, element, property, feature, advantage, or attribute that is not expressly recited in a claim should limit the scope of such claim in any way. Accordingly, the specification and drawings are to be regarded in an illustrative rather than a restrictive sense.

What is claimed is:

1. A system for testing a device under test (DUT), said system comprising:
   a test controller unit comprising a processor and a first memory, wherein said first memory is operable to store a data pattern;
   a second memory coupled to said test controller unit, wherein said second memory is smaller than said first memory, wherein portions of said data pattern are selectively transferred from said first memory to said second memory during and for DUT testing operations; and
   a third memory coupled to said second memory, said third memory being smaller than said second memory, wherein said third memory is operable to interface with said DUT for testing thereof and wherein further, portions of said data pattern are selectively transferred from said second memory to said third memory for application to said DUT.

2. The system of claim 1 wherein said data pattern is a random data pattern.

3. The system of claim 1 wherein said first memory of said test controller unit is a non-interleaved dynamic random access memory (DRAM), wherein said second memory is resident in a bridge circuit coupled to said test controller, and wherein said third memory is resident in a functional unit coupled to said bridge circuit and said DUT.

4. The system of claim 3 wherein said bridge circuit is a field programmable gate array (FPGA) circuit.

5. The system of claim 3 wherein said functional unit is an application specific integrated circuit (ASIC).

6. The system of claim 3 wherein an interrupt signal originating from said bridge circuit is operable to control transference of selected data pattern portions from said first memory to said second memory.

7. The system of claim 1 wherein data pattern contents of said first memory are compressed and data pattern contents of said third memory are decompressed, and wherein data pattern contents of said second memory are decompressed if decompression of data pattern contents occurs as part of their transfer to said second memory and compressed if decompression of data pattern contents occurs as part of their transfer to said third memory.

8. The system of claim 1 wherein said second memory comprises:
 a first portion for receiving data pattern portions from said first memory; and
 a second portion for supplying data pattern portions to said third memory, wherein data patterns portions are loaded into said first portion while other data pattern portions are transferred to said third memory.

9. A system for testing a device under test (DUT), said system comprising:
 a test controller unit comprising a processor and a first memory, wherein said first memory is operable to store a large data pattern of random data for testing non-volatile portions of said DUT;
 a bridge circuit coupled to said test controller unit and comprising a second memory, wherein said second memory is smaller than said first memory, wherein portions of said data pattern are selectively transferred from said first memory to said second memory during and for DUT testing operations; and
 a functional unit coupled to said bridge circuit and comprising a third memory, said third memory being smaller than said second memory, wherein said functional circuit is operable to interface with said DUT for testing thereof and wherein further, portions of said data pattern are selectively transferred from said second memory to said third memory for application to said DUT.

10. The system of claim 9 wherein said first memory of said test controller unit is a non-interleaved dynamic random access memory (DRAM) and wherein further said bridge circuit is a field programmable gate array (FPGA) circuit.

11. The system of claim 10 wherein said functional unit is an application specific integrated circuit (ASIC).

12. The system of claim 9 wherein data pattern contents of said first memory are compressed and data pattern contents of said third memory are decompressed, and wherein data pattern contents of said second memory are decompressed if decompression of data pattern contents occurs as part of their transfer to said second memory and compressed if decompression of data pattern contents occurs as part of their transfer to said third memory.

13. The system of claim 9 wherein said second memory comprises:
 a first portion for receiving data pattern portions from said first memory; and
 a second portion for supplying data pattern portions to said third memory, wherein data patterns portions are loaded into said first portion while other data pattern portions are transferred to said third memory and wherein an interrupt signal originating from said bridge circuit is operable to control transference of selected data pattern portions from said first memory to said second memory.

14. The system of claim 9 further comprising a test program for testing said DUT wherein portions of said test program execute on both said test controller unit and said functional unit simultaneously.

15. A method of testing a device under test (DUT), said method comprising:
 in a test controller unit, storing a data pattern for testing said DUT in a buffer memory;
 selectively transferring portions of said data pattern from said buffer memory to a first cache memory resident within a bridge circuit, wherein said first cache memory is smaller than said buffer memory;
 selectively transferring portions of said data pattern from said first cache memory to a second cache memory resident within a functional unit that is operable to interface with and perform testing operations on said DUT, wherein said second cache memory is smaller than said first cache memory and wherein further said operations of selectively transferring portions of said data pattern from said buffer memory to said first cache memory and of selectively transferring portions of said data pattern from said first cache memory to said second cache memory occur simultaneously; and
 applying data pattern portions of said second cache memory to said DUT for testing of said DUT, wherein said functional unit performs said applying operation.

16. The method of claim 15 wherein said data pattern is a random data pattern.

17. The method of claim 15 wherein said buffer memory of said test controller unit is a non-interleaved dynamic random access memory (DRAM), wherein said bridge circuit is a field programmable gate array (FPGA) circuit and wherein further said functional unit is an application specific integrated circuit (ASIC).

18. The method of claim 15 wherein data pattern contents of said first buffer are compressed and data pattern contents of said second cache memory are decompressed, and wherein data pattern contents of said first cache memory are decompressed if decompression of data pattern contents occurs as part of their transfer to said first cache memory and compressed if decompression of data pattern contents occurs as part of their transfer to said second cache memory.

19. The method of claim 15 wherein said selectively transferring said portions of said data pattern from said buffer memory to said first cache memory comprises transferring portions of said data pattern to a first portion of said first cache memory and wherein said selectively transferring portions of said data pattern from said first cache memory to a second cache memory comprises transferring portions of said data pattern from a second portion of said first cache memory to said second cache memory.

20. The method of claim 19 wherein said selectively transferring said portions of said data pattern from said buffer memory to said first cache memory is controlled by an interrupt signal originating from said bridge circuit.

* * * * *